(12) United States Patent
Bahl et al.

(10) Patent No.: US 11,227,805 B2
(45) Date of Patent: Jan. 18, 2022

(54) SYSTEM AND METHOD FOR SURGE-TESTING A GALLIUM NITRIDE TRANSISTOR DEVICE

(71) Applicant: TEXAS INSTRUMENTS INCORPORATED, Dallas, TX (US)

(72) Inventors: Sandeep Raj Bahl, Palo Alto, CA (US); Paul Brohlin, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 155 days.

(21) Appl. No.: 16/656,363

(22) Filed: Oct. 17, 2019

(65) Prior Publication Data

US 2020/0126874 A1 Apr. 23, 2020

Related U.S. Application Data

(60) Provisional application No. 62/749,425, filed on Oct. 23, 2018.

(51) Int. Cl.
*H01L 21/66* (2006.01)
*H01L 29/66* (2006.01)
(Continued)

(52) U.S. Cl.
CPC .......... *H01L 22/20* (2013.01); *G01R 31/2623* (2013.01); *H01L 29/2003* (2013.01); *H01L 29/66462* (2013.01); *H01L 29/7786* (2013.01)

(58) Field of Classification Search
CPC ................................................ G01R 31/2623
See application file for complete search history.

(56) References Cited

U.S. PATENT DOCUMENTS

2002/0116691 A1* 8/2002 Tsai ........................ H01L 22/20
716/115
2003/0055613 A1* 3/2003 Tsai ........................ H01L 22/20
703/2
(Continued)

OTHER PUBLICATIONS

S. Bahl et al. "A New Approach to Validate GaN FET Reliability to Power-line Surges Under Use-conditions" 2019 IEEE International Reliability Physics Symposium (IRPS) May 23, 2019 pp. 1-5 (Year: 2019).*

*Primary Examiner* — Grant S Withers
(74) *Attorney, Agent, or Firm* — Ray A. King; Charles A. Brill; Frank D. Cimino

(57) ABSTRACT

One example includes a method for surge-testing a gallium nitride (GaN) transistor device-under-test (DUT) that includes at least one GaN transistor device. The method includes inserting the GaN transistor DUT into a test fixture comprising an inductor such that the inductor is coupled to the GaN transistor device to form a switching power regulator. The method also includes operating the switching power regulator at a DUT operating voltage to generate an output current through the inductor based on a DUT input voltage and a duty-cycle. The method also includes controlling an excitation voltage source to provide a voltage surge-strike to the GaN transistor DUT. The method also includes measuring the output current and the DUT input voltage at least one of during and after the voltage surge-strike. The method further includes storing the measured output current and the measured DUT input voltage in a memory to specify device characteristics of the GaN transistor DUT.

23 Claims, 5 Drawing Sheets

(51) Int. Cl.
*G01R 31/26* (2020.01)
*H01L 29/20* (2006.01)
*H01L 29/778* (2006.01)

(56) References Cited

U.S. PATENT DOCUMENTS

| | | | |
|---|---|---|---|
| 2013/0229200 A1* | 9/2013 | Lou | G01R 31/2623 324/756.01 |
| 2015/0091601 A1* | 4/2015 | Ding | G01R 31/2623 324/762.01 |
| 2017/0229356 A1* | 8/2017 | Niimura | G01R 31/2601 |
| 2017/0276724 A1* | 9/2017 | Tadepalli | G01R 31/2623 |
| 2020/0403071 A1* | 12/2020 | Tadepalli | H01L 24/49 |

* cited by examiner

SYSTEM AND METHOD FOR SURGE-TESTING A GALLIUM NITRIDE TRANSISTOR DEVICE

RELATED APPLICATIONS

This application claims priority from U.S. Provisional Application No. 62/749,425, filed Oct. 23, 2018, which is incorporated herein by reference in its entirety.

TECHNICAL FIELD

This disclosure relates generally to electronic systems, and more specifically to a system and method for surge-testing a gallium-nitride (GaN) transistor device.

BACKGROUND

Switching power regulator systems are used for a variety of electronic devices to regulate a voltage (e.g., a direct current (DC) voltage) for operating electronic circuits (e.g., digital circuits). A variety of factors can lead to unexpected electrical surges that can provide elevated amplitudes of voltage that control such electronic circuits. For example, power distribution systems can be affected by both natural and equipment-related events that can cause electrical surges (e.g., transient over-voltages or line-surge conditions). The ability of circuit components to withstand such surges can be important for field reliability to maintain prolonged operation of the circuit components. In traditional silicon applications like power factor correction (PFC) circuits, much of the line surge can be attenuated by other components, like spark gaps, metal-oxide varistors (MOV's), EMI filters, and the power supply capacitors. A residual surge-front reaching a silicon power field-effect transistor (FET) can be dissipated by means of avalanche, rendering the avalanche rating of the silicon power FET important. However, gallium nitride (GaN) transistor devices do not have a high avalanche rating. Therefore, the transient overvoltage capability of GaN transistor devices can be used to design transient tolerant switching power regulator circuits.

SUMMARY

One example includes a method for surge-testing a gallium nitride (GaN) transistor device-under-test (DUT). The method includes coupling the GaN transistor DUT to a test fixture comprising an inductor such that the inductor is coupled to the GaN transistor DUT to form a switching power regulator. The method also includes operating the switching power regulator at a DUT operating voltage to generate an output current through the inductor based on a DUT input voltage. The method also includes controlling an excitation voltage source to provide a voltage surge-strike to the GaN transistor DUT. The method also includes measuring the output current and the DUT input voltage at least one of during and after the voltage surge-strike. The method further includes storing the measured output current and the measured DUT input voltage in a memory to specify device characteristics of the GaN transistor DUT.

Another example includes a test system for testing a GaN transistor device-under-test (DUT) comprising at least one GaN transistor device. The system includes a test fixture that includes an inductor, a load, and electrical connectors configured to couple to the GaN transistor DUT, such that the GaN transistor DUT, the load, and the inductor form a switching power regulator when the GaN transistor device is coupled to the connectors of the test fixture. The system also includes an excitation voltage source configured to provide a DUT input voltage to the GaN transistor DUT to operate the switching power regulator to generate an output current through the inductor based on the DUT input voltage, the excitation voltage source being further configured to provide a voltage surge-strike to the GaN transistor DUT. The system also includes a test controller configured to measure the output current and the DUT input voltage in response to the voltage surge-strike. The system further includes a memory configured to store the measured output current and the measured DUT input voltage to specify device characteristics of the GaN transistor DUT.

Another example includes a power supply circuit card. The circuit card includes at least one gallium nitride (GaN) transistor device. The circuit card also includes a first set of electrical connectors adapted to be coupled to respective connectors of a surge-test fixture and configured to communicate electrical signals with respect to the surge-test fixture for performing surge-testing of the at least one GaN transistor device by the surge-test fixture. The circuit card also includes a second set of electrical connectors adapted to be coupled to respective connectors of a parametric-test fixture and configured to communicate electrical signals with respect to the parametric-test fixture for performing device-relevant parametric characteristic testing of the at least one GaN transistor device by the parametric-test fixture.

Another example includes a method. The method includes fabricating a GaN transistor device-under-test (DUT) based on at least one fabrication parameter and surge-testing the GaN transistor DUT. Surge-testing the GaN transistor DUT includes coupling the GaN transistor DUT to a test fixture comprising an inductor such that the inductor is coupled to the GaN transistor DUT to form a switching power regulator. Surge-testing the GaN transistor DUT also includes operating the switching power regulator at a DUT operating voltage to generate an output current through the inductor based on a DUT input voltage. Surge-testing the GaN transistor DUT also includes controlling an excitation voltage source to provide a voltage surge-strike to the GaN transistor DUT. Surge-testing the GaN transistor DUT also includes measuring the output current and the DUT input voltage at least one of during and after the voltage surge-strike. Surge-testing the GaN transistor DUT further includes storing the measured output current and the measured DUT input voltage in a memory to specify device characteristics of the GaN transistor DUT. The method also includes comparing the specified device characteristics of the GaN transistor DUT with at least one specification. The method further includes fabricating a plurality of GaN transistor devices based on the at least one fabrication parameter in response to determining that the specified device characteristics of the GaN transistor DUT meet the at least one specification.

DETAILED DESCRIPTION

Figure 1:
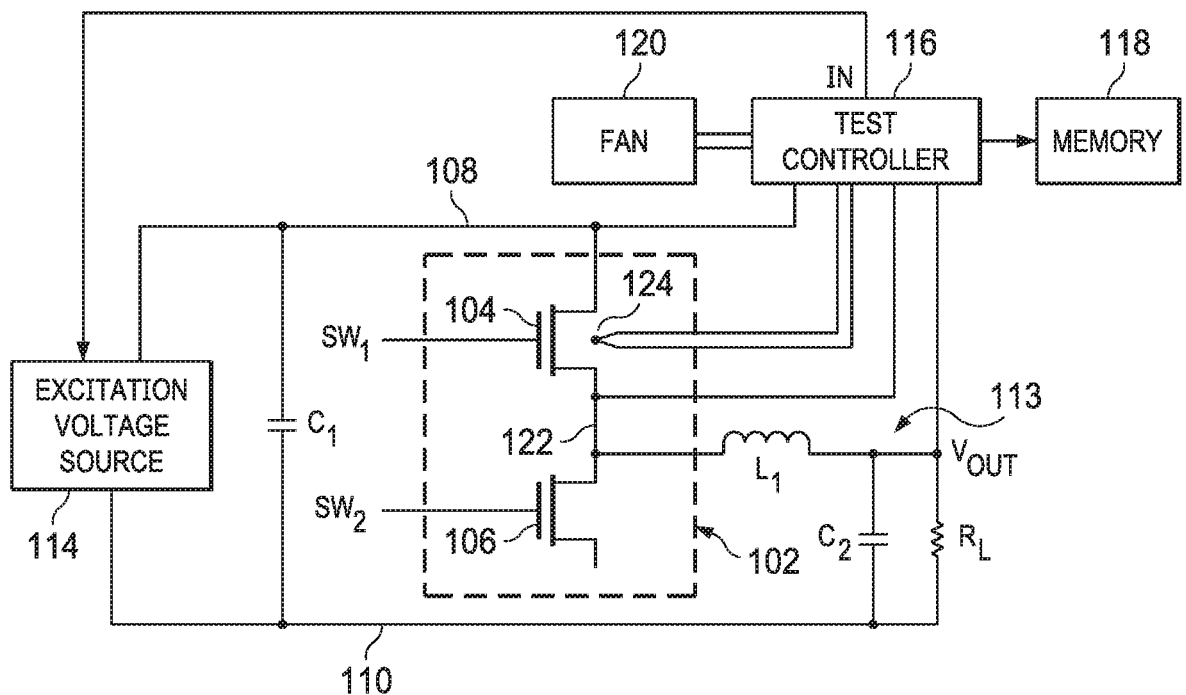
FIG. 1 illustrates an example of test system.

This disclosure relates generally to electronic circuits and systems, and more specifically to the system and method for surge-testing a gallium-nitride (GaN) transistor device. A GaN transistor DUT can be tested by a test fixture to provide test data that can be published for the GaN transistor DUT. Therefore, a user would be able to determine that the GaN transistor device was subjected to surge testing to allow the user to design a circuit to include the GaN transistor device in a manner to allow for a design that mitigates potential damage to the resulting circuit from a surge event. As described herein, the terms GaN transistor DUT and GaN transistor device are generally used interchangeably, with the term GaN transistor DUT being used to describe the GaN transistor device before and during testing, and the term GaN transistor device being used to describe the GaN transistor device post-testing. The term GaN transistor DUT can refer to an arrangement of one or more GaN transistor devices, which can be arranged together in a circuit, such as can include other circuit components. For example, the circuit includes one or more GaN transistors implemented on a power supply circuit card (e.g., a printed circuit board (PCB) card) that can be plugged into or otherwise connected to test system or a computer system (e.g., motherboard). As an example, the test data includes surge test data that includes a demonstration of operability of the GaN transistor device during and after a plurality of voltage surge strikes, and can also include data associated with an amplitude of the DUT input voltage and output current during each of the voltage surge strikes. As described herein, the term voltage surge-strike refers to a controlled rapid increase of the DUT input voltage from a first amplitude to a second amplitude that is greater than the first amplitude, followed by a decrease of the DUT input voltage back to the first amplitude. For example, the surge waveform conforms to a known standard, such as IEC61000-4-5.

The surge-test can be conducted for a GaN transistor DUT that is fabricated on a power supply circuit card (e.g., a printed circuit board (PCB) card) that can be manufactured as a plug-in device. For example, power supply circuit card includes connectors configured to be inserted into or otherwise coupled to mating connectors of the test fixture that is part of a test system. While connected, the power supply circuit card can be surge tested, and removed for packaging and sale as a single assembled component that can include the published surge-test data determined from such surge testing. The test fixture can include a receptacle or other connector configured to couple to terminals of the GaN transistor DUT. The test fixture can also include an inductor. Therefore, the GaN transistor DUT and the inductor can collectively form a switching power regulator in response to insertion of the GaN transistor power supply circuit card into the receptacle. As an example, the test fixture also includes additional components that may be necessary to form the switching power regulator, such as a load resistance and/or capacitors (e.g., associated with the input and/or the output of the switching power regulator). The test system can also include an excitation voltage source configured to provide a DUT input voltage to the GaN transistor DUT to operate the switching power regulator to generate an output current through the inductor based on the DUT input voltage.

The excitation voltage source can further be configured to initiate a voltage surge-strike to provide the voltage surge-strike to the GaN transistor DUT. For example, the excitation voltage source is configured with an operational baseline voltage to provide the DUT input voltage at a first amplitude, and can initiate the voltage surge strikes at other times/intervals to increase the DUT input voltage that is supplied to the GaN transistor DUT in a controlled manner. Therefore, the GaN transistor DUT can be surge-tested during operation of the switching power regulator to test for robust durability of the GaN transistor device in response to spurious overvoltage conditions that may occur during operation of the resulting switching power regulator in which the GaN transistor device is included. The surge-testing can be conducted a number of times, such as in accordance with a testing specification, and can further be surge-tested a number of additional times for margin testing of the GaN transistor DUT. A test controller can be configured to monitor the DUT input voltage and the output current through the inductor during the voltage surge strikes, and can store the amplitudes of the DUT input voltage and the output current in a memory, such as for publication of the values for validation of the GaN transistor device. As a result, the surge-testing and margin testing can be published to effectively prove durability of the resulting GaN transistor device to provide user confidence of the operation of the GaN transistor device.

FIG. 1 illustrates an example of test system 100. The test system 100 can be implemented for surge-testing of one or more GaN transistor DUTs, as described herein. The GaN transistor DUT(s) can be tested by a test fixture to provide test data that can be published for the resultant GaN transistor device(s). Therefore, a user of the GaN transistor device(s) can be able to determine that the GaN transistor device(s) was subjected to surge-testing to allow the user to design a circuit (e.g., including a switching power regulator) to include the GaN transistor device(s) in a manner to allow for a design that reduces potential damage to the resulting circuit. In other words, the user can have confidence in the robust durability of the GaN transistor device(s) in response to spurious overvoltage conditions during operation of a resulting switching power regulator.

The test system 100 includes GaN transistor DUT(s) 102 that is demonstrated in the example of FIG. 1 as including a high-side switch 104 and a low-side switch 106. In other examples, the GaN transistor DUT(s) 102 may include any number of one or more switches. The high-side switch 104 is demonstrated as a N-channel gallium nitride (GaN) field-effect transistor (FET, hereinafter transistor device), and the low-side switch 106 is demonstrated as an N-channel GaN transistor device in a totem-pole arrangement coupled between a high-voltage rail 108 and a low-voltage rail 110. The high-voltage rail 108 can correspond to a node on which a DUT input voltage $V_{IN}$ is provided, and the low-voltage rail 110 can correspond to a low-voltage reference (e.g., ground). In the example of FIG. 1, a capacitor $C_1$ interconnects the high-side switch 104 and the low-side switch 106. The high-side switch 104 and the low-side switch 106 are coupled at a switching node 112 that is further coupled to an inductor $L_1$ that is coupled to a load resistor $R_L$. In the example of FIG. 1, the inductor $L_1$ is coupled to the low-voltage rail 110 via a capacitor $C_2$.

As an example, the high-voltage rail 108, the low-voltage rail 110, the inductor $L_1$, the load resistor $R_L$, and/or the capacitors $C_1$ and $C_2$ can collectively form a test fixture that cooperates with the GaN transistor DUT(s) 102 to form a switching power regulator, demonstrated in the example of FIG. 1 as a buck power supply, that is configured to assist in the surge-testing of the GaN transistor DUT(s) 102, as described in greater detail herein. For example, the GaN transistor DUT(s) 102 can be inserted (e.g., as a GaN transistor power supply circuit card) into a receptacle (not shown) to couple the high-side switch 104 and the low-side switch 106 to the high-voltage rail 108, the low-voltage rail 110, and the switching node 112 to form the switching power regulator. Therefore, during operation of the switching power regulator, the inductor $L_1$ is configured to conduct an output current $I_{OUT}$ based on the alternate switching of the high-side switch 104 and the low-side switch 106 based on a defined duty-cycle to provide an output voltage $V_{OUT}$ across the load resistor $R_L$ at an output node 113.

For example, the high-side switch 104 and the low-side switch 106 can be controlled via a switching controller (not shown) that is part of the test fixture or part of the GaN transistor power supply circuit card to provide pulse-width modulation (PWM) control of the high-side switch 104 and the low-side switch 106 based on a feedback voltage that is associated with the output voltage $V_{OUT}$. As an example, the switching controller can generate gate voltages, demonstrated in the example of FIG. 1 as a first signal $SW_1$ and a second signal $SW_2$, that are provided to the gates of the respective high and low-side switches 104 and 106 based on a PWM signal having a defined duty-cycle. Therefore, the high and low-side switches 104 and 106 can be alternately activated to provide for alternating switching of the respective high and low-side switches 104 and 106. As a result, the high-side switch 104 can be activated by a first gate voltage to conduct a current from the high-voltage rail 108 through the high-side switch 104 to the switching node 112 during a first switching phase, and the low-side switch 106 can be activated by a second gate voltage to conduct a current from the low-voltage rail 110 through the low-side switch 106 to the switching node 112 during a first switching phase. The currents to the switching node 112 can thus correspond to the output current $I_{OUT}$ through the inductor $L_1$.

The test system 100 also includes an excitation voltage source 114 that is configured to generate the DUT input voltage $V_{IN}$ to operate the switching power regulator to generate the output current $I_{OUT}$ through the inductor $L_1$ via the high-side switch 104 and the low-side switch 106 based on the DUT input voltage $V_{IN}$. The excitation voltage source 114 can further be configured to initiate a voltage surge-strike to provide the voltage surge-strike to the GaN transistor DUT(s) 102 to implement the surge-testing. For example, the excitation voltage source 114 can be programmed via an input signal IN to provide the DUT input voltage $V_{IN}$ at a first amplitude, and to initiate the voltage surge strikes at defined times/intervals to increase the DUT input voltage $V_{IN}$ to the GaN transistor DUT(s) 102 in a controlled manner. Therefore, the GaN transistor DUT(s) 102 can be surge-tested during operation of the switching power regulator to test for robust durability of the high-side switch 104 and the low-side switch 106 in response to spurious overvoltage conditions that may occur during operation of the resulting switching power regulator in which the respective GaN transistor devices of the GaN transistor DUT(s) 102 are included.

Figure 2:
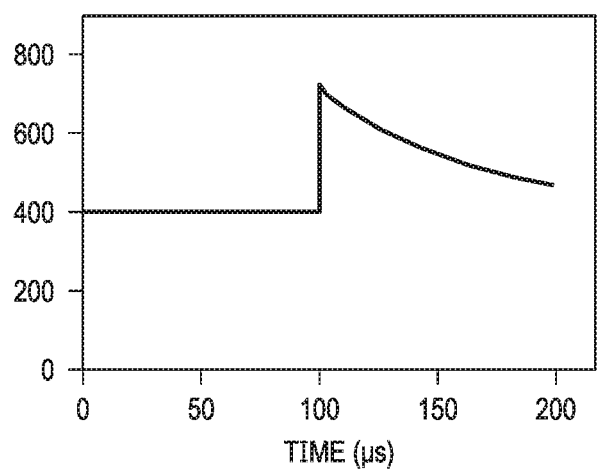
FIG. 2 illustrates an example timing diagram of a surge-strike.

FIG. 2 illustrates an example timing diagram 200 of a surge-strike. The timing diagram 200 demonstrates a single voltage surge-strike, such as generated by the excitation voltage source 114 in the example of FIG. 1. Therefore, reference is to be made to the example of FIG. 1 in the following description of the example of FIG. 2.

By way of example, the timing diagram 200 demonstrates the DUT input voltage $V_{IN}$ provided by the excitation voltage source 114 plotted as a function of time in microseconds (µs). The timing diagram 200 begins at 0 µs with a baseline operational DUT input voltage $V_{IN}$ of approximately 400 volts corresponding to a nominal operating voltage for the switching power regulator associated with the GaN transistor DUT(s) 102. It is to be understood that the baseline operational DUT input voltage $V_{IN}$ can have been established prior to the 0 µs time. Therefore, the switching power regulator can generate the output voltage $V_{OUT}$ based on the output current $I_{OUT}$ through the inductor $L_1$ that is provided through each of the high-side switch 104 and the low-side switch 106 via alternate switching between the DUT input voltage $V_{IN}$ at the high-voltage rail 108 (e.g., approximately 400 volts) and zero volts at the low-voltage rail 110, respectively, at a defined duty-cycle.

After approximately 100 µs, the DUT input voltage $V_{IN}$ increases to an amplitude of approximately 720 volts corresponding to a voltage surge-strike amplitude. For example, the excitation voltage source 114 can be configured (e.g., via the input signal IN) to rapidly increase the DUT input voltage $V_{IN}$ from the baseline voltage amplitude to the voltage surge-strike amplitude at a specific time (e.g., the 100 µs time). While the surge voltage amplitude in the example of FIG. 2 is demonstrated as approximately 720 volts, it is to be understood that any of a variety of voltages can be used as a surge voltage amplitude. Subsequently, the amplitude of the DUT input voltage $V_{IN}$ can decay from the voltage surge-strike amplitude back to the baseline amplitude (e.g., according to a predefined specification). As an example, the excitation voltage source 114 can be programmed to initiate multiple consecutive voltage surge strikes at predefined intervals, with each of the voltage surge strikes being approximately equal in amplitude and duration.

Referring back to the example of FIG. 1, the test system 100 also includes a test controller 116 that is configured to monitor an amplitude of the DUT input voltage $V_{IN}$ and the amplitude of the output current $I_{OUT}$. As an example, the test controller 116 is configured as a processor or as a portion of a processor, an application specific integrated circuit (ASIC), a portion of a program, or any of a variety of other combinations of hardware/software/firmware. In the example of FIG. 1, the test controller 116 is coupled to the high-voltage rail 108, to the switching node 112, and to the output node 113 to provide monitoring capability of the amplitudes of each of the DUT input voltage $V_{IN}$, the switching node voltage that can correspond to the input voltage of the low-side switch 106, and the output current $I_{OUT}$, such as prior to, during, and after a voltage surge-strike event. For example, the monitoring of each of the DUT input voltage $V_{IN}$, the switching node voltage, and the output current $I_{OUT}$ can occur before, during, and after the voltage surge-strike, such as to obtain operating point measurements of reference amplitudes before and after a surge-strike, and for example between surge strikes, and to obtain operating point measurements during the voltage surge strikes. As an example, the excitation voltage source 114 can be programmable (e.g., via a user or external connection) with a voltage surge-strike set point to provide the DUT input voltage $V_{IN}$ at an amplitude that is associated with an open-circuit condition. In the example of FIG. 1, the input signal IN is demonstrated as being provided from the test controller 116, such that the test controller 116 can be programmed to provide the associated commands to control the excitation voltage source 114.

Therefore, upon installation of the GaN transistor DUT(s) 102, the amplitude of the DUT input voltage $V_{IN}$ may change upon loading the circuit associated with the respective test fixture, such that the voltage surge-strike set point that is programmed via the input signal IN may not be equal to the actual voltage surge-strike amplitude that is provided on the high-voltage rail 108. As a result, the test controller 116 can measure the actual amplitudes of each of the DUT input voltage $V_{IN}$ and the output current $I_{OUT}$. While the monitoring of the input voltage herein is described with respect to the DUT input voltage $V_{IN}$, it is to be understood that the voltage of the switching node 112 can also be monitored as the input voltage to the low-side switch 106. Therefore, as described herein, the term DUT input voltage can also refer to the voltage of the switching node 112, generally. Additionally, while the test controller 116 is demonstrated by example as measuring the output current $I_{OUT}$ through the inductor $L_1$, it is to be understood that the test controller 116 can be coupled to other parts of the switching power regulator to measure the amplitude of the corresponding current.

As another example, the test controller 116 can be configured to take additional measurements. For example, the test controller 116 can also measure the input current, such as through at least one of the high-side switch 104 and the low-side switch 106. The test controller 116 can also measure the output voltage $V_{OUT}$ across the load $R_L$. As a result, the test controller 116 can measure efficiency of the GaN transistor DUT(s) 102 based on a power input versus power output analysis. As yet another example, the test controller 116 can include other instruments, such as an oscilloscope, to capture fast time-varying waveforms of the measured parameter(s). Therefore, the test controller 116 can measure the current values and the peak voltage of the voltage surge-strike, and can control the firing of the surge component in the excitation voltage source 114. Accordingly, the test controller 116 can provide additional test/diagnostic capability and control.

Therefore, the test controller 116 can be configured to take measurements of the DUT input voltage $V_{IN}$ and the output current $I_{OUT}$ and store the respective amplitudes in a memory 118. As described herein, the measurements that are stored in the memory 118 can be implemented for calibration of the switching power regulator, such as to provide subsequent surge testing of the GaN transistor DUT(s) 102 and additional GaN transistor DUTs thereafter, or for the actual surge testing of the GaN transistor DUT(s) 102. For example, the surge-testing can be conducted a number of times, such as in accordance with a testing specification, and can further be surge-tested an additional number of times for margin testing of the GaN transistor DUT(s) 102. The amplitudes of the DUT input voltage $V_{IN}$ and the output current $I_{OUT}$ can thus be published for validation of the high-side switch 104 and the low-side switch 106. As a result, the surge-testing and margin testing can be published to effectively prove durability of the resulting GaN transistor devices to provide user confidence of the operation of the GaN transistor devices.

Additionally, in the example of FIG. 1, the test system 100 further includes a fan 120 configured to provide temperature control of the GaN transistor DUT(s) 102, such as during the surge testing of the GaN transistor DUT(s) 102. For example, the test controller 116 can be configured to monitor a temperature of the GaN transistor DUT(s) 102 (e.g., the high-side switch 104, as demonstrated in the example of FIG. 1) via a thermal measurement sensor (e.g., a thermocouple), demonstrated at 124, and to provide a control signal to the fan 120 to maintain an approximate constant temperature to the GaN transistor DUT(s) 102. Therefore, the GaN transistor DUT(s) 102 can be surge-tested under controlled temperature conditions, such as at an approximately constant operational temperature or range of temperatures.

Therefore, as described herein, the GaN transistor DUT(s) 102 can be surge tested to provide an indication of the voltage overhead capability of the GaN transistor devices. For example, a residual surge-front reaching a silicon FET can be dissipated by means of avalanche, rendering the avalanche rating of the silicon power FET important. For example, a GaN transistor device can have at least five times a voltage headroom relative to a typical silicon transistor device. However, because GaN transistor devices do not have a high avalanche rating, the surge-testing described herein can provide necessary data associated with a transient overvoltage capability of the GaN transistor devices to facilitate the design of transient tolerant switching power regulators circuits using GaN transistor devices. Furthermore, as described in greater detail herein, the surge-testing of the GaN transistor devices can be used to determine whether a large lot of GaN transistor devices should be mass fabricated in response to determining that a test portion of the fabricated GaN transistor devices conform to one or more defined specifications associated with the overvoltage capability.

Figure 3:
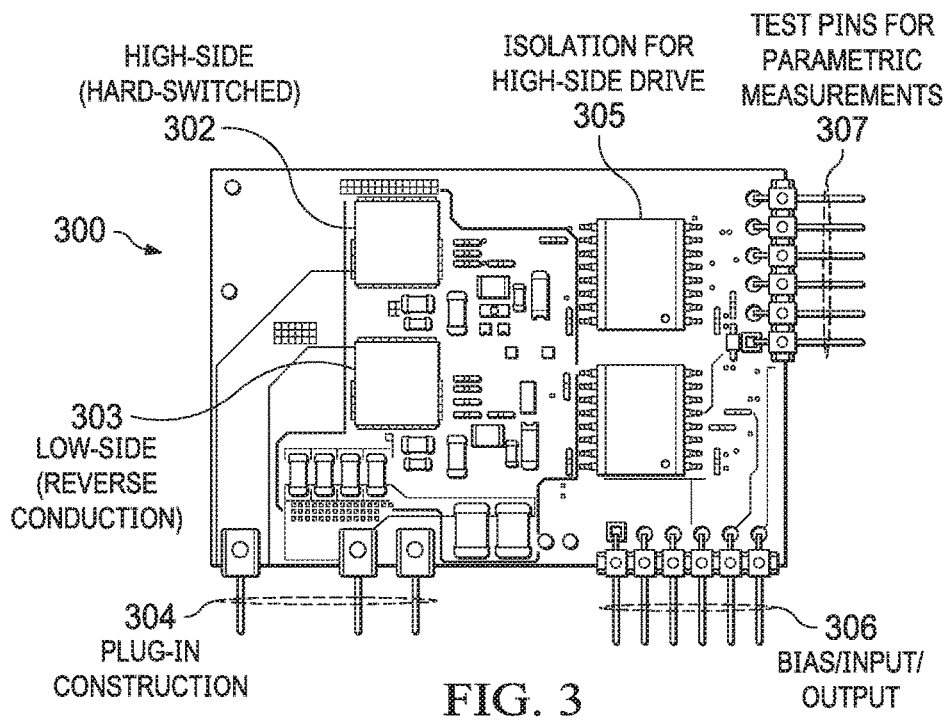
FIG. 3 illustrates an example of a power supply circuit card.

FIG. 3 illustrates an example of a power supply circuit card 300. The power supply circuit card 300 is demonstrated as a printed circuit board (PCB) card that is manufactured as a plug-in component that can be sampled for test purposes or could be sold as a user product. For example, the power supply circuit card 300 can be inserted into the test fixture, surge tested, and removed as a single assembled modular component that can include published surge-test data that is determined from the surge testing, as described herein. As another example, the GaN transistor power supply circuit card 300 can then be packaged and sold to a consumer, with the product literature incorporating the published surge-test data, or can be incorporated into another product for sale or used for other power-providing objectives, with the published surge-test data indicating the performance and/or efficiency of the DUT(s) on the GaN transistor power supply circuit card 300.

In the example of FIG. 3, the GaN transistor power supply circuit card 300 includes two GaN transistor devices 302 and 303 arranged in a totem-pole configuration. In other examples, a different numbers of GaN transistor devices may be used. As an example, the GaN transistor devices 302 and 303 can correspond to the high-side switch 104 and the low-side switch 106 in the example of FIG. 1. In the example of FIG. 3, the GaN transistor power supply circuit card 300 includes an isolation element 305 for the GaN transistor device 302 (e.g., the high-side switch 104). The GaN transistor power supply circuit card 300 includes a plug-in construction 304 having electrical connectors 306, and 307. For example, the connectors are configured to enable, the GaN transistor power supply circuit card 300 to be one of multiple GaN transistor DUTs that can be sequentially inserted in the associated test fixture (e.g., in the test system 100 of the example of FIG. 1) for testing and determination of device parameters as disclosed herein.

In the example of FIG. 3, the plug-in construction 304 includes pins or other connectors configured to couple to the high-side and low-side rails 108 and 110 and the switching node 112. The set of electrical connectors 306 of the circuit card 300 are pins or other terminal connectors of an electrically conductive material that are adapted to couple to mating connectors (e.g., receptacles) of the test fixture (e.g., the test system 100). For example, the electrical connectors 306 correspond to associated with bias/input/output terminals, and can thus provide conductive contact with the low-voltage DC power supply to power electronics, the PWM input, and/or a fault output. Similarly, the set of electrical connectors 307 (e.g., pins or other connectors) are adapted to couple to mating connectors of a parametric-test fixture and configured to provide device-relevant parametric characteristic testing of the at least one GaN transistor device through the respective connectors 307. The connectors 306 and 307 thus are configured to communicate electrical signals for performing respective tests of the GaN transistor devices. As an example, the test connectors 307 provide conductive contact with mating connectors of a parametric tester for the measurement of other device-relevant parametric characteristics of the GaN transistor devices 302 and 303, such as threshold voltage $V_T$, on-resistance $R_{DSON}$, and/or terminal leakage currents. For example, the device-relevant parametric characteristics of the GaN transistor devices 302 and 303 can be tested via the test system 100, or can be tested via another dedicated parametric test system. As an example, the GaN transistor power supply circuit card 300 can be removed from the test system 100 after being surge-tested through connectors 306 and can be plugged-in to the dedicated parametric test system through connectors 307 for testing the device-relevant parametric characteristics of the GaN transistor devices 302 and 303. The device-relevant parametric characteristics of the GaN transistor devices 302 and 303 can be tested by activating and deactivating the GaN transistor devices 302 and 303 (e.g., via activation circuitry) to test the device-relevant parametric characteristics of the GaN transistor devices 302 and 303.

While the GaN transistor DUT(s) 102 includes a high-side switch (e.g., the high-side switches 104 and 302, respectively) and a low-side switch (e.g., the low-side switches 106 and 303, respectively), the GaN transistor DUT(s) described herein are not limited to including both high and low-side switches. For example, the GaN transistor DUT(s) 102 can include only a single GaN transistor device, such as for a boost converter or for a non-power converting switching circuit. Therefore, the GaN transistor DUT(s) 102 are described herein as examples, and are not limited to including both high and low-side switches for a buck switching converter. Additionally, the GaN transistor power supply circuit card 300 can include any of a variety of components associated with the switching power regulator that forms the test system 100. For example, the GaN transistor power supply circuit card 300 can include associated components that are coupled with the GaN transistor devices 302 and 303 to enable high-speed operation of the switching power regulator and to reduce undesirable parasitic effects that could result from conductive connection through the connectors 304 and 306.

Referring back to the example of FIG. 1, as described herein, the excitation voltage source 114 can be programmable with a voltage surge-strike set point to provide the DUT input voltage $V_{IN}$ at an amplitude that is associated with an open-circuit condition, but which can be different when the GaN transistor DUT 102 is inserted into the receptacle of the test fixture to provide a loaded condition of the excitation voltage source 114. Therefore, the test system 100 may need to be calibrated before the test system 100 can provide surge-testing of one or more GaN transistor DUTs.

Figure 4:
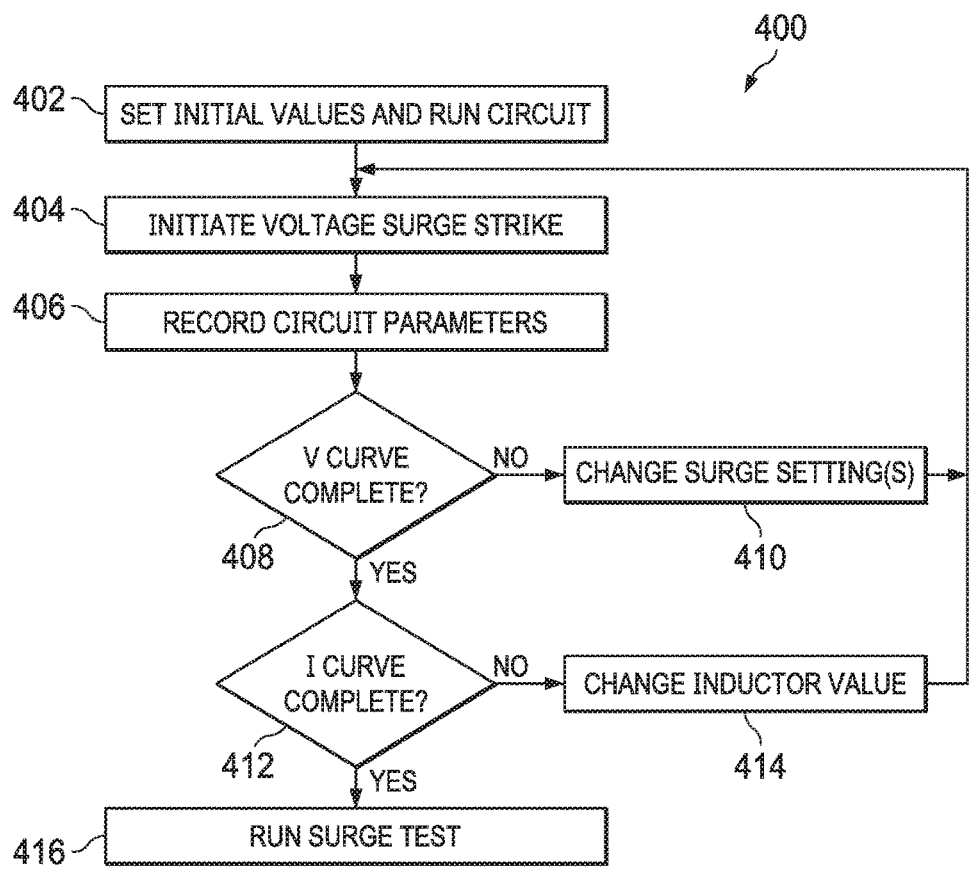
FIG. 4 illustrates an example state diagram of a calibration procedure.

FIG. 4 illustrates an example flow diagram 400 of a calibration procedure. The calibration procedure 400 can correspond to calibration of the test system 100 (e.g., implemented by test controller 116) to provide subsequent surge-testing of GaN transistor DUTs. Therefore, reference is to be made to the example of FIG. 1 in the following description of the example of FIG. 4. As an example, in providing the calibration procedure, a calibration GaN transistor power supply card can be inserted into the test fixture of the test system 100, such that the calibration procedure can be performed with the calibration GaN transistor device prior to performing surge-testing on the GaN transistor DUT 102. Alternatively, the GaN transistor DUT 102 can be implemented for the calibration procedure, such that each subsequent GaN transistor DUT 102 can be calibrated prior to undergoing surge-testing.

At 402, initial values are set for the test system (e.g., a circuit) 100, and the test system 100 is operated. As an example, at 402, the test controller 116 sets the initial values for operating the test system in combination with the excitation voltage source 114 (e.g., to provide the nominal DUT input voltage $V_{IN}$ to operate the test system 100). For example, the initial values can include the nominal amplitude of the DUT input voltage $V_{IN}$, as well as a voltage surge-strike amplitude of the DUT input voltage $V_{IN}$, as set by the excitation voltage source 114. In addition, the initial values can also include an initial inductance value of the inductor $L_1$. For example, the inductor $L_1$ can have a variable inductance to provide a range of testing parameters for the test system 100 in testing GaN transistor DUTs, as described herein. The test system 100 can then be operated as a switching power regulator at 402, such that the DUT input voltage $V_{IN}$ is provided at the nominal amplitude to the GaN transistor DUT 102, and the high and low-side switches 104 and 106 are alternately switched to provide the output current $I_{OUT}$ through the inductor $L_1$ to generate an output voltage $V_{OUT}$ across the load resistor $R_L$.

At 404, a voltage surge-strike is initiated. As an example, the excitation voltage source 114 initiates the voltage surge-strike, such as in response to the input signal IN provided from the test controller 116. The voltage surge-strike can correspond to the voltage surge-strike demonstrated in the example of FIG. 2, in which the DUT input voltage $V_{IN}$ rapidly increases from the nominal amplitude to the voltage surge-strike amplitude, after which the DUT input voltage $V_{IN}$ decreases back to the nominal amplitude. The test system 100 continues to operate during the voltage surge-strike event, such that the DUT input voltage $V_{IN}$ is provided at the nominal amplitude to the GaN transistor DUT 102, and the high and low-side switches 104 and 106 are alternately switched to provide the output current $I_{OUT}$ through the inductor $L_1$ to generate an output voltage $V_{OUT}$ across the load resistor $R_L$, similar to as described previously.

At 406, circuit parameters are recorded. For example, the test controller 116 can measure the amplitude of the DUT input voltage $V_{IN}$ and the output current $I_{OUT}$, such as corresponding to the circuit parameters, in response to the voltage surge-strike (e.g., before and during the voltage surge-strike). For example, the test controller 116 can measure a peak DUT input voltage $V_{IN}$ in response to the voltage surge-strike, such as at the approximate 100 µs time in the example of FIG. 2. The test controller 116 can provide the measured DUT input voltage $V_{IN}$ and the measured output current $I_{OUT}$ to the memory 118 to store the circuit parameters, such as to determine peak values associated with the voltage surge-strike and/or with timestamps associated with the time of the measured circuit parameters.

Figure 5:
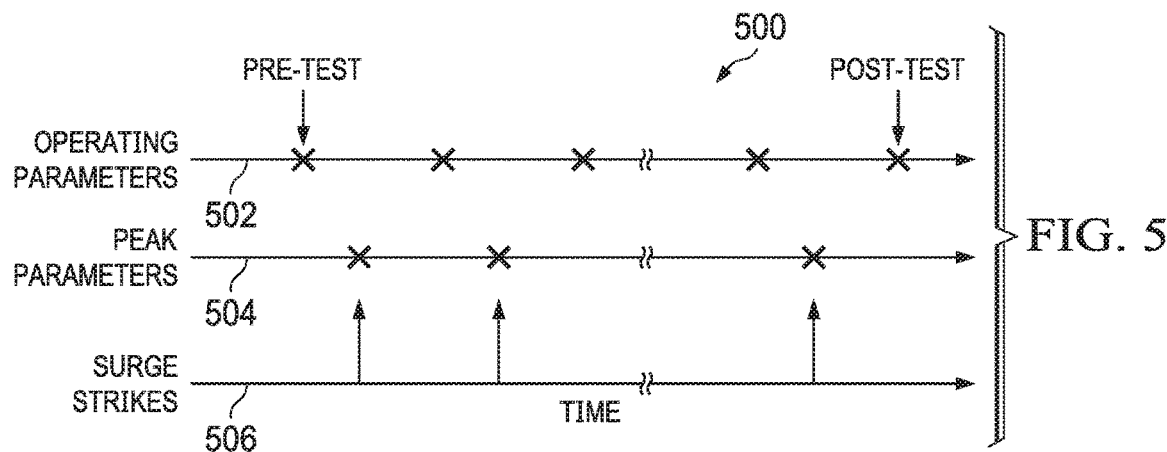
FIG. 5 illustrates an example timing diagram of measurement times of the test system.

FIG. 5 illustrates an example timing diagram 500 of measurement times of the test system. The timing diagram 500 demonstrates a relative timing of the measurement times of both operating parameters 502 and peak parameters 504 relative to the timing of surge strikes, demonstrated at 506. In the example of FIG. 5, the measurement times are indicated by an X along the respective timeline. For example, a pre-test can be performed prior to a voltage surge-strike with respect to the operating parameters of the switching power regulator of the test system 100, thus corresponding to normal operating parameters (e.g., including input current and output voltage $V_{OUT}$, as well as the DUT input voltage $V_{IN}$ and the output current $I_{OUT}$). In response to a voltage surge-strike, peak parameters can be measured, as described herein, such as corresponding to the amplitude of the DUT input voltage $V_{IN}$ and the output current $I_{OUT}$. Additionally, a post-test can be performed after the voltage surge-strike with respect to the operating parameters of the switching power regulator of the test system 100, thus corresponding to normal operating parameters. As a result, the efficiency of the GaN transistor DUT 102 can be measured based on the measured operational parameters, both before and after the voltage surge-strike.

Referring back to the example of FIG. 4, at 408, a determination is made as to whether the voltage (V) curve corresponding to the DUT input voltage $V_{IN}$ is complete. As an example, the test controller 116 evaluates the recorded circuit parameters to determine if the V curve is sufficiently complete. For example, the calibration procedure can correspond to obtaining a range of the actual DUT input voltage $V_{IN}$, as measured by the test controller 116, relative to the programmed voltage surge-strike set point, as set by the excitation voltage source 114. Therefore, the method 400 can determine if the entirety of a range of values of a voltage curve of measured DUT input voltage $V_{IN}$ relative to set DUT input voltage $V_{IN}$ is complete. If the voltage curve is not complete (NO), the method 400 proceeds to 410, at which the surge setting(s) (e.g., the voltage surge-strike amplitude) are changed, and the method 400 returns to 404 to provide another voltage surge-strike with the new surge setting(s) (e.g., the voltage surge-strike amplitude). For example, at 410, the test controller 116 changes the surge setting(s) via the input signal IN provided to the excitation voltage source 114.

Figure 6:
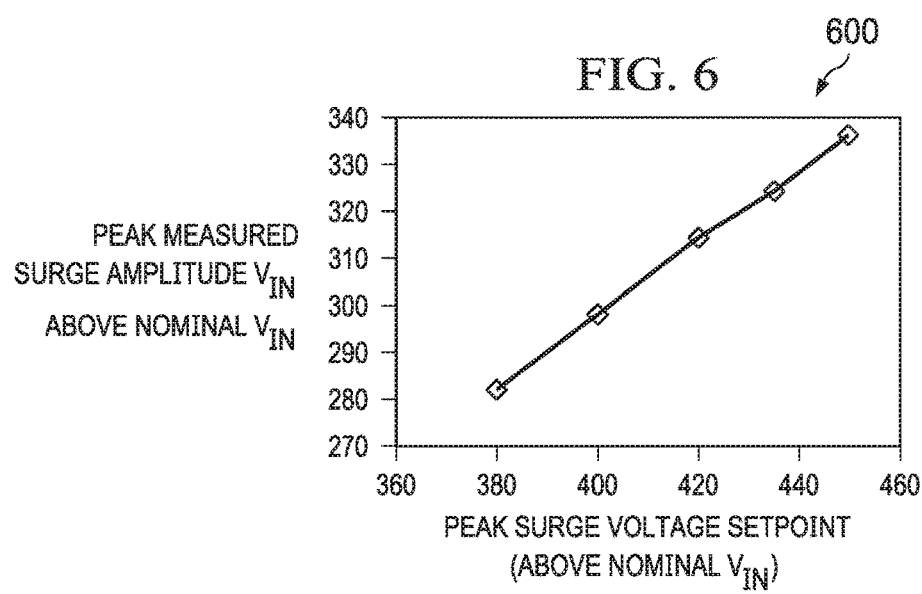
FIG. 6 illustrates an example diagram of a calibration voltage graph.

FIG. 6 illustrates an example diagram 600 of a calibration voltage graph. The calibration voltage graph demonstrates values of the voltage surge-strike amplitude above a nominal operating amplitude of the DUT input voltage $V_{IN}$. The calibration voltage graph demonstrates a peak measured amplitude of the DUT input voltage $V_{IN}$, corresponding to a maximum voltage surge-strike amplitude (e.g., as a difference amplitude greater than the nominal baseline operating amplitude of the DUT input voltage $V_{IN}$) as measured by the test controller 116, on the Y-axis plotted as a function of the peak surge voltage set point above the nominal baseline operating amplitude of the DUT input voltage $V_{IN}$, corresponding to a maximum voltage surge-strike amplitude (e.g., as a difference amplitude greater than the nominal baseline operating amplitude of the DUT input voltage $V_{IN}$) as set at the excitation voltage source 114, on the X-axis.

In the example of FIG. 6, the diagram 600 demonstrates five separate calibration points on the calibration voltage graph, at approximately 380 volts, approximately 400 volts, approximately 420 volts, approximately 435 volts, and approximately 450 volts. In response, during the calibration procedure demonstrated in the example of FIG. 4, the voltage surge-strike amplitude of the DUT input voltage $V_{IN}$ (e.g., demonstrated in the example of FIG. 6 as peak measured surge amplitude $V_{IN}$), as measured by the test controller 116, are approximately 282 volts, approximately 298 volts, approximately 314 volts, approximately 324 volts, and approximately 336 volts, respectively. Thus, the calibration voltage graph of the diagram 600 can be generated based on setting a surge-strike amplitude set point of approximately 380 volts (e.g., as a difference amplitude greater than the nominal baseline operating amplitude of the DUT input voltage $V_{IN}$) at the step 402, initiating a surge-strike at 404, measuring and recording the DUT input voltage $V_{IN}$ at 406 (e.g., corresponding to the maximum voltage surge-strike amplitude as a difference amplitude greater than the nominal baseline operating amplitude of the DUT input voltage $V_{IN}$ as measured by the test controller 116), changing the set voltage surge-strike amplitude to approximately 400 volts at the step 410, and beginning again with another surge-strike at 404. The method 400 can repeat until a number of data points in the calibration voltage curve of the diagram 600 are achieved (e.g., the desired set point is sufficiently bracketed by amplitudes).

Returning to the example of FIG. 4, in response to the determination of the voltage curve being complete (YES) at 408, the method 400 proceeds to 412, at which a determination is made as to whether the current (I) curve corresponding to the output current $I_{OUT}$ is complete. As an example, the test controller 116 evaluates the recorded circuit parameters to determine if the I curve is sufficiently complete. For example, the calibration procedure can correspond to obtaining a range of the output current $I_{OUT}$, as measured by the test controller 116, relative to the inductance of the inductor $L_1$. Therefore, the method 400 can determine if the entirety of a range of values of a current curve of the output current $I_{OUT}$ relative to the inductance of the inductor $L_1$ is complete. If the current curve is not complete (NO), the method 400 proceeds to 414, at which the inductance value of the inductor $L_1$ is changed, and the method 400 returns to 404 to provide another voltage surge-strike with the new inductance value. For example, the test controller 116 changes the inductance value of the inductor $L_1$ to the new inductance value, such that the test controller 116 can command the excitation voltage source 114 to initiate another voltage surge-strike in response to the input signal IN.

Figure 7:
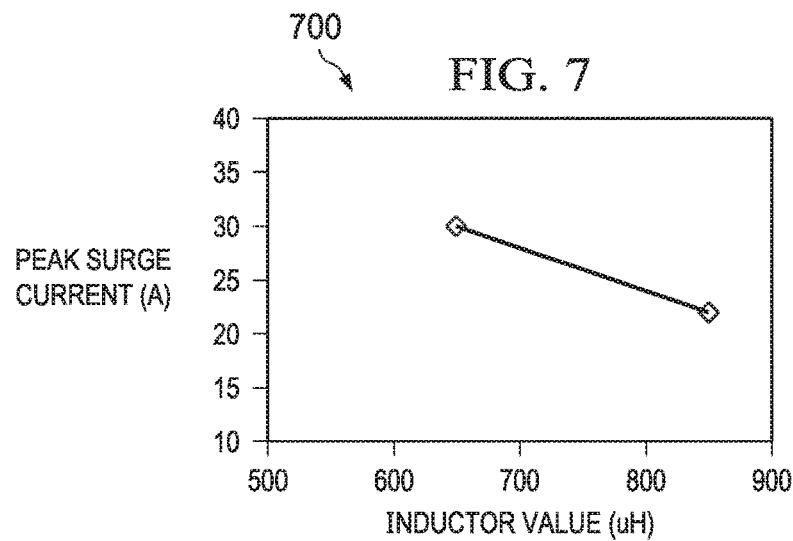
FIG. 7 illustrates an example diagram of a calibration inductance graph.

FIG. 7 illustrates an example diagram 700 of a calibration current graph. The calibration current graph demonstrates values of the peak amplitude in amps of the output current $I_{OUT}$ on the Y-axis, as measured by the test controller 106, plotted as a function of the inductance (in µH) of the output inductor $L_1$ on the X-axis. In the example of FIG. 7, the diagram 700 demonstrates two separate calibration points on the calibration current graph, at approximately 650 µH and approximately 850 µH. In response, during the calibration procedure demonstrated in the example of FIG. 4, the circuit parameters for the output current $I_{OUT}$, as measured by the test controller 116, are approximately 30 amps and approximately 22 amps, respectively. Thus, the calibration current graph of the diagram 700 can be generated based on setting an initial set inductance of the inductor $L_1$ of approximately 650 µH at the step 402, initiating a surge-strike at 404, measuring and recording the output current $I_{OUT}$ at 406 (e.g., corresponding to the output current $I_{OUT}$ as measured by the test controller 116), changing the set inductance of the inductor $L_1$ to approximately 850 µH at the step 414, and beginning again with another surge-strike at 404. The method 400 can repeat until a number of data points in the calibration current curve of the diagram 700 are achieved.

The examples of FIGS. 6 and 7 are provided merely as examples. Therefore, it is to be understood that more or less than five data points can be acquired for the DUT input voltage $V_{IN}$ and more or less than two data points can be acquired for the output current $I_{OUT}$. Additionally, it is to be understood that the calibration procedure to generate the calibration voltage and current curves can be conducted concurrently for data points in the respective calibration curves, as opposed to sequentially.

Figure 8:
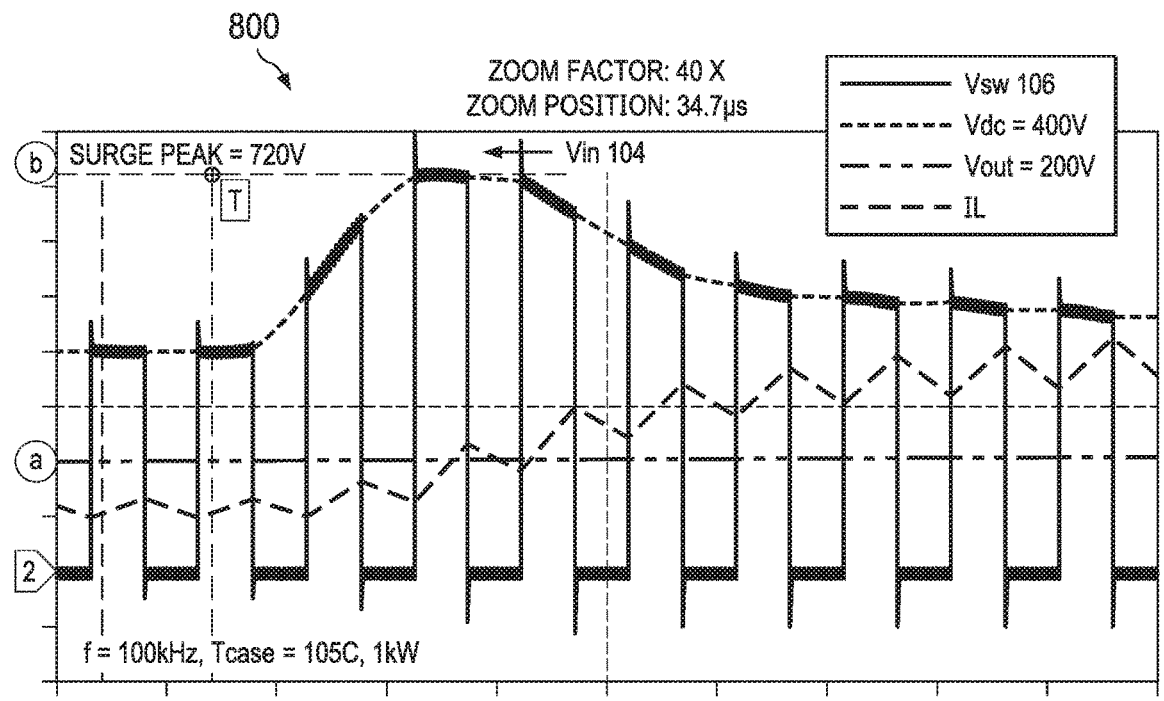
FIG. 8 illustrates an example diagram of parameter measurement in response to a surge-strike.

Returning to the example of FIG. 4, in response to the determination of the current curve being complete (YES) at 412, the method 400 proceeds to 416, at which the method 400 indicates completion of the calibration procedure, and provides that surge-testing for the GaN transistor DUT 102 can begin. FIG. 8 illustrates an example diagram 800 of parameter measurement in response to a surge-strike. The diagram 800 demonstrates the result of the success of the calibration methodology of FIGS. 4-7, in which a surge-strike occurs, resulting in the DUT input voltage $V_{IN}$ being measured at approximately 720V and the peak amplitude of the output current $I_{OUT}$ set to approximately 20 A. In the example of FIG. 8, the DUT input voltage $V_{IN}$ surges from the nominal input voltage amplitude of approximately 400V to a desired example amplitude of approximately 720V, similar to as demonstrated in the example of FIG. 2, and the output current $I_{OUT}$ surges from the operating value of approximately 5 A to a surge peak amplitude of about 20 A. Accordingly, the example of FIG. 8 demonstrates a successful calibration methodology, as provided in the examples of FIGS. 4-7.

Figure 9:
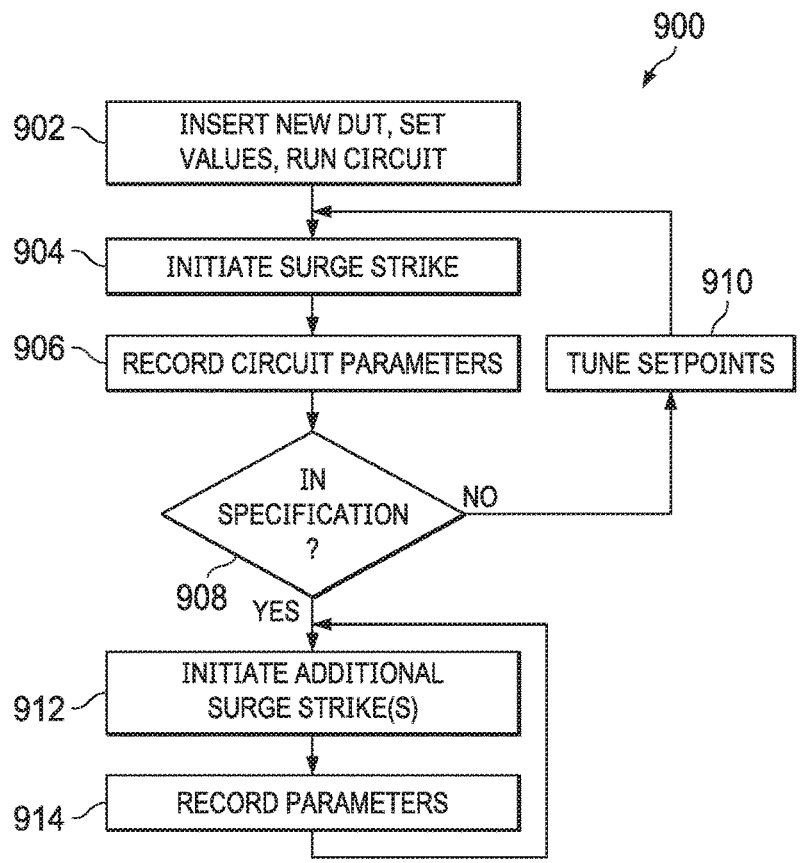
FIG. 9 illustrates an example state diagram of a surge test.

FIG. 9 illustrates an example flow diagram 900 of a method to perform a voltage surge test. The voltage surge test in the method 900 can correspond to a voltage surge test of the GaN transistor DUT 102 in the example of FIG. 1. For example, the test controller 116 is configured to implement at least a portion of the method 900 of FIG. 9. Therefore, reference is to be made to the example of FIG. 1 in the following description of the example of FIG. 9.

At 902, a new GaN transistor power supply card (e.g., the GaN transistor power supply circuit card 300) is inserted into the test fixture of the test system 100, values are set for the test system 100, and the test system 100 is operated (e.g., by test controller 116). For example, the initial values can include the nominal amplitude of the DUT input voltage $V_{IN}$, as well as a voltage surge-strike amplitude of the DUT input voltage $V_{IN}$, as set by the excitation voltage source 114. In addition, the initial values can also include the inductance value of the inductor $L_1$. The test system 100 can then be operated as a switching power regulator at 902, such that the DUT input voltage $V_{IN}$ is provided at the nominal amplitude to the GaN transistor DUT 102, and the high and low-side switches 104 and 106 of the GaN transistor DUT 102 are alternately switched to provide the output current $I_{OUT}$ through the inductor $L_1$ to generate an output voltage $V_{OUT}$ across the load resistor $R_L$.

At 904, a voltage surge-strike is initiated. As an example, the step 904 of the diagram 900 is performed by the excitation voltage source 114 to initiate the voltage surge-strike, such as in response to the input signal IN provided from the test controller 116. The voltage surge-strike can correspond to the voltage surge-strike demonstrated in the example of FIG. 2, in which the DUT input voltage $V_{IN}$ rapidly increases from the nominal amplitude to the voltage surge-strike amplitude, after which the DUT input voltage $V_{IN}$ decreases back to the nominal amplitude. The test system 100 continues to operate during the voltage surge-strike event, such that the DUT input voltage $V_{IN}$ is provided at the nominal amplitude to the GaN transistor DUT 102, and the high and low-side switches 104 and 106 are alternately switched to provide the output current $I_{OUT}$ through the inductor $L_1$ to generate an output voltage $V_{OUT}$ across the load resistor $R_L$, similar to as described previously.

At 906, circuit parameters are recorded. For example, the test controller 116 measures the amplitude of the DUT input voltage $V_{IN}$ and the output current $I_{OUT}$, such as corresponding to the circuit parameters, in response to the voltage surge-strike (e.g., before and during the voltage surge-strike). For example, the test controller 116 measures a peak DUT input voltage $V_{IN}$ in response to the voltage surge-strike, such as at the approximate 100 µs time in the example of FIG. 2. The test controller 116 can provide the measured DUT input voltage $V_{IN}$ and the measured output current $I_{OUT}$ to the memory 118 to store the circuit parameters, such as to determine peak values associated with the voltage surge-strike and/or with timestamps associated with the time of the measured circuit parameters. The measurement times can correspond to the measurement times described previously in the example of FIG. 5, as described previously.

At 908, it is determined whether the circuit parameters are within a set of predefined specifications (e.g., such as for validation of the GaN transistor DUT 102). As an example, the test controller 116 determines whether the circuit parameters are within the set of predefined specifications. For example, the specifications can correspond to expected values of the circuit parameters, such as based on the calibration procedure described in the examples of FIGS. 4-7. If the circuit parameters are not within the predefined specifications (NO), the method 900 proceeds to 910, at which the set points of the test system 100 can be tuned. As an example, the test controller 116 tunes the set points of the test system 100 to within the predefined specifications. For example, the tuning of the set points can correspond to ensuring that the initial values were correctly set and/or are defined by the calibration curves defined in the examples of FIGS. 6 and 7. As another example, it can be determined if the calibration experienced drift with respect to operational parameters of the test system (e.g., such as affected by environmental considerations). As yet another example, the tuning of the set points can also correspond to identification of a failed GaN transistor DUT 102. In the absence of a failed GaN transistor DUT, after the set points of the test system 100 are tuned, the method 900 returns to 904 to provide another voltage surge-strike with the tuned set points.

If the circuit parameters have been determined to be within specification (YES), then the method 900 proceeds to 912, at which an additional one or more voltage surge-strikes are initiated. As an example, the step 912 of the method 900 is performed by the excitation voltage source 114 to initiate the one or more additional voltage surge-strike, such as in response to the input signal IN provided from the test controller 116. For example, the number of voltage surge strikes that can be initiated can correspond to a quantity (e.g., fifty) based on a predefined specification (e.g., VDE 0884-11), such as for properly validating the GaN transistor DUT 102. In response to each of the voltage surge-strikes, the method 900 proceeds to 914, at which the circuit parameters are recorded again. For example, the test controller 116 can measure the amplitude of the DUT input voltage $V_{IN}$ and the output current $I_{OUT}$, such as corresponding to the circuit parameters, in response to each of the voltage surge-strikes. Alternatively or additionally, the test controller 116 can measure the amplitude of the DUT input voltage $V_{IN}$ and the output current $I_{OUT}$ in response to achieving the quantity of the voltage surge-strikes. The test controller 116 can provide the measured DUT input voltage $V_{IN}$ and the measured output current $I_{OUT}$ to the memory 118 to store the circuit parameters, such that the measured DUT input voltage $V_{IN}$ and the measured output current $I_{OUT}$ can be published and included in product literature for the resultant GaN transistor device to demonstrate validity of the resultant GaN transistor device.

In addition, as an example, the voltage surge-testing can also include margin testing. In the example of FIG. 9, upon measuring and storing the measured input voltage and the measured output current $I_{OUT}$, the method 900 can return to 912, at which an additional one or more voltage surge strikes are initiated for a margin test corresponding to additional testing to demonstrate durability of the resultant GaN transistor device. As an example, the step 912 of the method 900 is be performed by the excitation voltage source 114 to initiate the one or more voltage surge strikes are initiated for a margin test, such as in response to the input signal IN provided from the test controller 116. For example, the number of voltage surge strikes that can be initiated can correspond to a quantity (e.g., fifty) based on a predefined specification for the margin test.

Upon reaching the quantity of voltage surge strikes for the margin test, the method 900 can again proceed to 914, at which the circuit parameters are recorded again. For example, the test controller 116 can measure the amplitude of the DUT input voltage $V_{IN}$ and the output current $I_{OUT}$, such as corresponding to the circuit parameters, in response to each of the voltage surge-strikes. Alternatively or additionally, the test controller 116 can measure the amplitude of the DUT input voltage $V_{IN}$ and the output current $I_{OUT}$ in response to achieving the quantity of the voltage surge-strikes. After a set number of additional strikes are initiated at 912 and circuit parameters recorded 914, the surge testing of the DUT can end. The test controller 116 can provide the measured DUT input voltage $V_{IN}$ and the measured output current $I_{OUT}$ to the memory 118 to store the circuit parameters for the margin test, such that the measured DUT input voltage $V_{IN}$ and the measured output current $I_{OUT}$ can be published and included in the product literature for the resultant GaN transistor device to demonstrate the margin testing of the resultant GaN transistor device.

Figure 10:
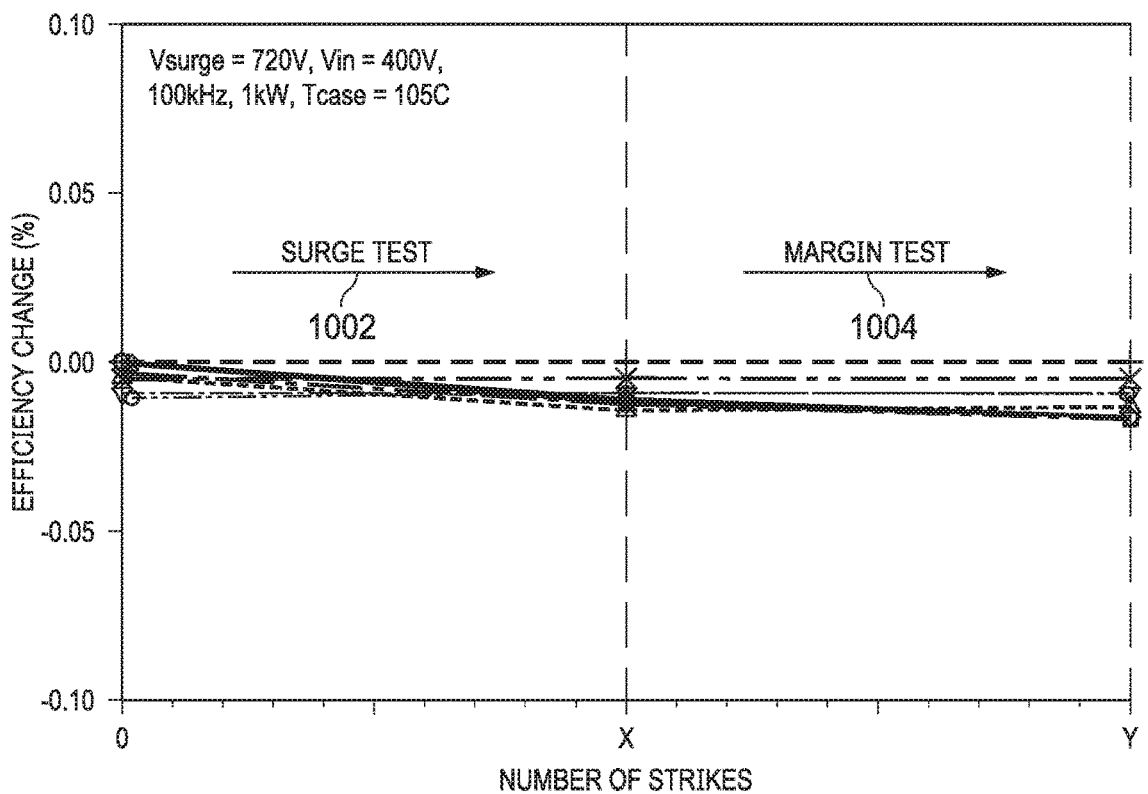
FIG. 10 illustrates an example of surge testing and margin testing of a GaN transistor DUT.

FIG. 10 illustrates an example diagram 1000 of surge testing and margin testing of a GaN transistor DUT. The surge testing and margin testing can be for the GaN transistor DUT 102, such as based on the surge-testing described in the example of FIG. 9. The diagram 1000 demonstrates a change of efficiency of the GaN transistor DUT 102 on the Y-axis plotted relative to a number of voltage surge strikes on the X-axis. The diagram 1000 thus demonstrates stable efficiency for the GaN transistor DUT 102 upon the conclusion of both the surge testing at 1002 after a number X strikes (e.g., fifty strikes) and the margin test at 1004 after a number Y strikes (e.g., one-hundred strikes, or fifty additional strikes). A chart demonstrating efficiency, similar to the example diagram 1000, can be published in product literature for the resultant GaN transistor device.

Figure 11:
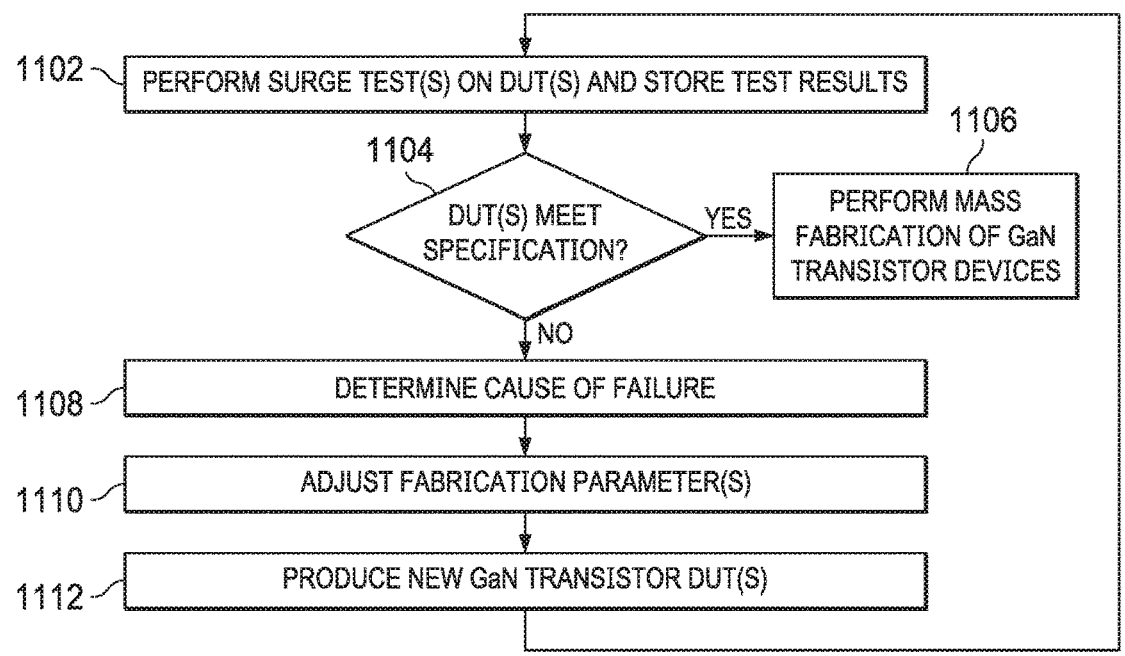
FIG. 11 illustrates an example of a diagram of a method for fabricating GaN transistor devices.

FIG. 11 illustrates an example flow diagram 1100 of a method to fabricate GaN transistor devices based on specification(s). The diagram 1100 can correspond to fabrication workflow for GaN transistor devices that includes surge testing, such as disclosed herein. As an example, because there are significant costs associated with the mass production of GaN transistor devices, the method 1100 can be implemented to validate the costs for fabricating a batch of GaN transistor devices. Thus, the method 1100 may be implemented to confirm that the fabrication parameters (e.g., design and process parameters) that were utilized for producing the GaN transistors in the DUTs (e.g., devices 102, 302, 303) meet desired specifications and justify the cost before subsequent mass fabrication of corresponding GaN transistor devices. For example, the method 1100 is performed based on and/or after a voltage surge test, such as the voltage surge test of the GaN transistor DUT 102 in the example of FIG. 1 and/or in the method 900 of the example of FIG. 9. Therefore, reference is to be made to the examples of FIGS. 1 and 9 in the following description of the example of FIG. 11.

At 1102, surge-test(s) are performed on the GaN transistor DUT(s) (e.g., the GaN transistor DUT(s) 102). For example, the surge-testing at 1102 can correspond to the surge-testing described in the example of FIGS. 1, 5, 8, 9 and 10. Additionally, at 1102, the surge-testing results can be recorded (e.g., stored in memory, published in product literature, etc.), including to specify a quantity of successful surge strikes of a number of GaN transistor devices that are fabricated and packaged according to a set of respective fabrication parameters. As described herein, the term fabrication parameter may refer to process parameters, such as associated with the fabrication process (e.g., operational and/or environmental considerations during fabrication, layer materials, fabrication steps, layer thicknesses, materials used during fabrication or other fabrication considerations). Additionally or alternatively, the term fabrication parameter may refer to design parameters (e.g., layout, dimensions, substrate materials, such as silicon or GaN, or any other considerations related to the structure of features that form the GaN transistor devices during fabrication). For example, the GaN transistor DUT(s) can be associated with the power supply circuit card 300 in the example of FIG. 3, and the surge-testing can be performed by the test system 100.

At 1104, it is determined whether the surge-testing of the GaN transistor DUT(s) is within one or more specifications. For example, the specification(s) can correspond to any of a variety of the operational parameters that can be indicative of whether the GaN transistor DUT(s) are acceptable for subsequent operation in a switching voltage regulator or other such circuit, such as by a consumer or in a larger circuit that is provided as a consumer product. As an example, the surge-testing at 1102 can be applied to determine specification(s) including maintained operation through the surge-testing, consistent voltage, current, and/or power settings, switching speed, or any of a variety of other desired operational parameters. For example, the specification(s) can be stored in and determined by the test controller 116 in the example of FIG. 1 for each GaN transistor DUT. The testing at 1102 may be repeated for a number (e.g., 100, 200 or more) of GaN transistor DUT(s) that include GaN transistor devices produced according to a common set of fabrication parameters (e.g., process and/or design parameters).

In response to a determination that the GaN transistor DUT(s) meet the specification(s) (YES), mass fabrication of the GaN transistor devices can be performed, as provided at 1106. For example, the GaN transistor DUT(s) undergoing the surge-testing at 1102 can correspond to a test lot in a fabrication process. In response to the test controller 116 determining that the GaN transistor DUT(s) meet the specification(s), then it can be determined that the fabrication parameters can be satisfactory for mass fabrication of additional GaN transistor devices under the same corresponding fabrication materials, processes, and/or environmental considerations.

For example, the mass fabrication of the GaN transistor devices at 1106 can include implementing the same fabrication processes as used to produce the GaN transistor devices in the respective DUT(s). The fabrication at 1106 can also include packaging the GaN transistor devices, labeling the GaN transistor devices, and publishing/storing the surge-test information (e.g., in product literature). As a further example, fabricating the GaN transistor devices can include fabricating GaN transistor devices distributed across a wafer, such that the wafer can be separated into individual die (e.g., by cutting or otherwise breaking the wafer). Each die thus include one or more respective GaN transistor device. The separated individual die can then be encapsulated in a molded packaging material (e.g., a thermosetting polymer or thermoplastic material) to form a respective integrated circuit (IC) chip device that can correspond to a respective GaN transistor device. For example, the packaged IC chip device can include terminals to couple the IC chip device to a PCB (e.g., similar to or equivalent to the two GaN transistor devices 302 and 303 in the example of FIG. 3). Each IC chip device can include electrical connectors such as pins, ball bonds or the like.

In response to a determination at 1104 that the GaN transistor DUT(s) do not meet the specification(s) (NO), then it is determined that there may be a failure associated with the fabrication process. At 1108, the cause of failure of the GaN transistor DUT(s) that resulted in a lack of specification results associated with the surge-testing can be determined. For example, the failure determination can be based on the one or more of the specification(s) that were not met. As an example, the diagnosis of the failure can be performed by diagnostic tools, by fabrication operators, by the fabrication tools, by the test controller 116, or by any of a variety of other methods.

Following a determination at 1108 of the cause of failure of the GaN transistor DUT(s) to meet the specification(s) associated with the surge-test, the fabrication parameter(s) can be adjusted at 1110. For example, in response to a determination of the source of failure for the particular GaN transistor DUT(s), the corresponding fabrication materials, processes, and/or environmental considerations can be adjusted for producing a new set of GaN transistor DUT(s). As an example, the fabrication operators can change the fabrication parameters based on the fabrication tools or the test controller 116 in a manner related to the failure. At 1112, a new set of GaN transistor DUT(s) can be produced based on the new fabrication parameter(s) that were adjusted at 1110. Therefore, the surge-testing can be performed on the new set of GaN transistor DUT(s) again at 1102 to attempt to meet the specification(s) before mass fabrication of GaN transistor devices can be performed (e.g., at 1106).

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite a, an, a first, or another element, or the equivalent thereof, it should be interpreted to include one or more than one such element, neither requiring nor excluding two or more such elements. As used herein, the term includes means includes but not limited to, and the term including means including but not limited to. The term based on means based at least in part on.

What is claimed is:

1. A method for surge-testing a gallium nitride (GaN) transistor device-under-test (DUT), the method comprising:
   coupling the GaN transistor DUT to a test fixture that includes an inductor that is coupled to the GaN transistor DUT to form a switching power regulator;
   operating the switching power regulator to provide an output current through the inductor in response to a DUT input voltage and a duty-cycle;
   controlling an excitation voltage source to provide a voltage surge-strike to the GaN transistor DUT;
   measuring the output current and the DUT input voltage after the voltage surge-strike; and
   storing the measured output current and the measured DUT input voltage in a memory.

2. The method of claim 1, further comprising calibrating the test fixture using a calibration GaN transistor device prior to coupling the GaN transistor DUT to the test fixture.

3. The method of claim 2, wherein calibrating the test fixture comprises:
   inserting the calibration GaN transistor device into the test fixture;
   setting a sequence of surge-strike voltage amplitudes of the excitation voltage source;
   controlling the excitation voltage source to provide calibration voltage surge strikes at each of the respective surge-strike voltage amplitudes in the sequence;
   measuring the DUT input voltage in response to the calibration voltage surge strikes; and
   recording the measured DUT input voltage amplitudes in response to the calibration voltage surge strikes.

4. The method of claim 2, wherein calibrating the test fixture comprises:
   inserting the calibration GaN transistor device into the test fixture;
   setting a sequence of surge-strike voltage amplitudes of the excitation voltage source;
   controlling the excitation voltage source to initiate calibration voltage surge strikes at each of the respective surge-strike voltage amplitudes in the sequence;
   measuring the output current in response to each of the calibration voltage surge strikes; and
   recording the measured output current in response to each of the calibration voltage surge strikes.

5. The method of claim 2, further comprising:
   determining if the measured output current and the measured DUT input voltage are within a range of specifications defined by an output current calibration range and a DUT input voltage calibration range;
   changing a voltage surge-strike set point in response to the measured DUT input voltage being outside of the DUT input voltage calibration range; and
   changing an inductance value of the inductor in response to the measured output current being outside of the output current calibration range.

6. The method of claim 1, further comprising:
   measuring the output current and the DUT input voltage at a time prior to the voltage surge-strike, and storing the measured output current and the measured DUT input voltage prior to and subsequent to the voltage surge-strike.

7. The method of claim 1, further comprising:
measuring a temperature of the GaN transistor DUT in response to the voltage surge-strike; and
controlling a temperature element to maintain a defined temperature of the GaN transistor DUT responsive to the measured temperature.

8. The method of claim 1, wherein controlling the excitation voltage source comprises controlling the excitation voltage source to provide a number of voltage surge strikes to the GaN transistor DUT over a time interval, and wherein measuring the output current and the DUT input voltage comprises measuring the output current and the DUT input voltage after each of the number of voltage surge strikes.

9. The method of claim 8, wherein the number of voltage surge strikes is a first number of voltage surge strikes, the method further comprising:
controlling the excitation voltage source to provide a second number of voltage surge strikes to the GaN transistor DUT after the first number of voltage surge strikes;
measuring the output current and the DUT input voltage after each of the second number of voltage surge strikes; and
storing the measured output current and the measured DUT input voltage of each of the second number of voltage surge strikes in the memory.

10. The method of claim 1, wherein coupling the GaN transistor DUT to the test fixture includes inserting, into the test fixture, a GaN transistor power supply circuit card that includes the GaN transistor DUT.

11. The method of claim 1, wherein:
coupling the GaN transistor DUT to the test fixture includes inserting a first GaN transistor DUT and a second GaN transistor DUT into the test fixture, wherein the first and second GaN transistor DUTs are configured to provide high-side switching and low-side switching, respectively, for the switching power regulator,
controlling the excitation voltage source comprises controlling the excitation voltage source to provide the voltage surge-strike to the first and second GaN transistor DUTs, and
storing the measured output current and the measured input voltage comprises storing the measured output current and the measured DUT input voltage in the memory.

12. The method of claim 1, further comprising:
measuring an input current associated with the GaN transistor DUT and an output voltage associated with the switching power regulator before and during the voltage surge-strike; and
storing the measured input current and the measured output voltage in the memory.

13. The method of claim 1, further comprising:
fabricating the GaN transistor DUT;
measuring a device characteristic of the fabricated GaN transistor DUT;
comparing the measured device characteristic of the GaN transistor DUT with a specification; and
fabricating a plurality of GaN transistor devices in response to determining that the device characteristic is within the specification.

14. The method of claim 13, further comprising:
determining a cause of failure in response to determining that the device characteristic is outside the specification;
adjusting a fabrication parameter; and
fabricating a modified GaN transistor DUT based on the adjusted at fabrication parameter and repeating the surge-testing on the modified GaN transistor DUT.

15. A test system for testing a gallium nitride (GaN) transistor device-under-test (DUT), the system comprising:
a test fixture comprising an inductor, a load, and electrical connectors configured to couple to the GaN transistor DUT, wherein the GaN transistor DUT, the load, and the inductor form a switching power regulator when the GaN transistor DUT is coupled to at least one of the electrical connectors;
an excitation voltage source coupled to the GaN transistor DUT, and configured to provide a DUT input voltage to the GaN transistor DUT, the switching power regulator providing an output current through the inductor in response to the DUT input voltage and a duty-cycle, the excitation voltage source being further configured to provide a voltage surge-strike to the GaN transistor DUT;
a test controller configured to measure the output current and the DUT input voltage in response to the voltage surge-strike; and
a memory configured to store the measured output current and the measured DUT input voltage.

16. The system of claim 15, wherein the test controller is further configured to measure an input current and an output voltage associated with the GaN transistor DUT after the voltage surge-strike, and store the measured input current and the measured output voltage in the memory.

17. The system of claim 15, wherein the excitation voltage source is configured to provide a number of voltage surge strikes to the GaN transistor DUT, and wherein the test controller is configured to measure the output current and the DUT input voltage in response to each of the voltage surge strikes.

18. The system of claim 17, wherein the number of voltage surge strikes is a first number of voltage surge strikes, wherein the excitation voltage source is configured to initiate a second number of voltage surge strikes after the first number of voltage surge strikes to provide each of the second number of voltage surge strikes to the GaN transistor DUT, wherein the test controller is configured to measure the output current and the DUT input voltage in response to a last of the second number of voltage surge strikes, wherein the memory is configured to store the measured output current and the measured DUT input voltage in response to each of the second number of voltage surge strikes.

19. The system of claim 15, wherein the test controller is configured to:
determine if the measured output current and the measured DUT input voltage are within a range of specifications defined by calibration values associated with the output current and the DUT input voltage;
change a voltage surge-strike set point in response to the measured DUT input voltage being outside of the range of specifications; and
change an amplitude of an inductance of the inductor in response to the measured output current being outside of the range of specifications.

20. A method comprising:
fabricating a GaN transistor device-under-test (DUT) based on at least one fabrication parameter;

surge-testing the GaN transistor DUT comprising:
- coupling the GaN transistor DUT to a test fixture that includes an inductor coupled to the GaN transistor DUT to form a switching power regulator;
- operating the switching power regulator at a DUT operating voltage to provide an output current through the inductor responsive to a DUT input voltage and a duty-cycle;
- controlling an excitation voltage source to provide a voltage surge-strike to the GaN transistor DUT;
- measuring the output current and the DUT input voltage at a time after the voltage surge-strike; and
- storing the measured output current and the measured DUT input voltage in a memory;

comparing the specified device characteristics of the GaN transistor DUT with a specification; and fabricating a plurality of GaN transistor devices based on the fabrication parameter in response to determining that the specified device characteristics of the GaN transistor DUT meets the at least one specification.

21. The method of claim 20, further comprising:
- determining a cause of failure in response to determining that the specified device characteristics of the GaN transistor DUT does not meet the specification;
- adjusting at least one of the at least one fabrication parameter; and
- fabricating an additional GaN transistor DUT based on the adjusted at least one of the at least one fabrication parameter and repeating the surge-testing on the additional GaN transistor DUT.

22. The method of claim 20, further comprising fabricating the plurality of GaN transistor devices on a wafer.

23. The method of claim 22, further comprising:
- separating the wafer into individual die, each die comprising a respective GaN transistor device; and
- encapsulating each die in a packaging material to form an integrated circuit chip device.

\* \* \* \* \*